(12) United States Patent
Yudovsky et al.

(10) Patent No.: US 7,779,527 B2
(45) Date of Patent: Aug. 24, 2010

(54) METHODS AND APPARATUS FOR INSTALLING A SCRUBBER BRUSH ON A MANDREL

(75) Inventors: Joseph Yudovsky, Campbell, CA (US); Tai T Ngo, Dublin, CA (US); Leon Volfovski, Mountain View, CA (US); Anne-Douce M P Coulin, Stanford, CA (US)

(73) Assignee: Applied Materials, Inc., Santa Clara, CA (US)

( * ) Notice: Subject to any disclaimer, the term of this patent is extended or adjusted under 35 U.S.C. 154(b) by 131 days.

(21) Appl. No.: 12/245,762

(22) Filed: Oct. 5, 2008

(65) Prior Publication Data

US 2009/0025197 A1 Jan. 29, 2009

Related U.S. Application Data

(62) Division of application No. 11/048,099, filed on Jan. 28, 2005, now abandoned.

(60) Provisional application No. 60/540,140, filed on Jan. 29, 2004.

(51) Int. Cl.
*B23Q 3/00* (2006.01)

(52) U.S. Cl. ....................................................... 29/464

(58) Field of Classification Search ................. 29/464, 29/468, 234, 235, 282, 428; 151/179; 166/173; 15/179
See application file for complete search history.

(56) References Cited

U.S. PATENT DOCUMENTS

| 490,831 | A | 1/1893 | Lohers |
|---|---|---|---|
| 511,606 | A | 12/1893 | Frink |
| 780,768 | A | 1/1905 | Wiggins |
| 1,613,396 | A | 1/1927 | Keller, Sr. |
| 1,744,365 | A | 1/1930 | Burgess |
| 1,748,414 | A | 2/1930 | Gibson et al. |
| 2,029,459 | A | 2/1936 | Fred |
| 2,509,957 | A | 5/1950 | Briggs |
| 2,563,049 | A | 8/1951 | Liebelt et al. |
| 2,565,743 | A | 8/1951 | Schaefer |
| 2,667,867 | A | 2/1954 | Petersen |
| 2,739,429 | A | 3/1956 | Peterson |
| 2,894,744 | A | 7/1959 | Schulze |

(Continued)

FOREIGN PATENT DOCUMENTS

DE 9211938 U1 11/1992

(Continued)

OTHER PUBLICATIONS

Notice of Abandonment of U.S. Appl. No. 11/048,099 mailed Feb. 2, 2010.

(Continued)

*Primary Examiner*—John C Hong
(74) *Attorney, Agent, or Firm*—Dugan & Dugan

(57) ABSTRACT

In a first aspect, an apparatus is provided for forming a scrubber brush assembly. The apparatus includes a mandrel adapted to be inserted into a scrubber brush so as to form a scrubber brush assembly, the mandrel having: a first end; a second end; and one or more position guides adjacent at least one of the first and second ends and adapted to position a scrubber brush on the mandrel. Numerous other aspects are provided.

20 Claims, 11 Drawing Sheets

U.S. PATENT DOCUMENTS

| | | |
|---|---|---|
| 3,060,555 A | 10/1962 | Kirshenbaum |
| 3,129,960 A | 4/1964 | Schrodt |
| 3,182,345 A | 5/1965 | Smith |
| 3,380,097 A | 4/1968 | Pharris |
| 3,466,691 A | 9/1969 | Wessel |
| 3,519,277 A | 7/1970 | Crocker |
| 3,574,880 A | 4/1971 | Butzen |
| 3,584,328 A | 6/1971 | Lechene et al. |
| 3,649,985 A | 3/1972 | Hunt |
| 3,679,277 A | 7/1972 | Dohmen |
| 3,774,982 A | 11/1973 | Nakamura et al. |
| 3,812,551 A | 5/1974 | Mortensen |
| 3,827,492 A | 8/1974 | Hammon et al. |
| 3,879,786 A | 4/1975 | Larkin |
| 3,919,754 A | 11/1975 | Sorresso |
| 3,943,593 A | 3/1976 | Gould et al. |
| 3,971,097 A | 7/1976 | Clark |
| 4,135,553 A | 1/1979 | Evans et al. |
| 4,165,551 A | 8/1979 | Rosseau |
| 4,326,619 A | 4/1982 | Garnett |
| 4,348,067 A | 9/1982 | Tooley |
| 4,361,923 A | 12/1982 | McKay |
| 4,438,812 A | 3/1984 | Hammon |
| 4,557,506 A | 12/1985 | Hanks et al. |
| 4,561,763 A | 12/1985 | Basch |
| 4,846,531 A | 7/1989 | Boland et al. |
| 4,914,777 A | 4/1990 | Cartellone |
| 4,972,939 A | 11/1990 | Uttke et al. |
| 5,036,625 A | 8/1991 | Gosis |
| 5,046,231 A | 9/1991 | Thompson |
| 5,342,282 A | 8/1994 | Letourneur |
| 5,375,291 A | 12/1994 | Tateyama et al. |
| 5,461,464 A | 10/1995 | Swain |
| 5,475,889 A | 12/1995 | Thrasher et al. |
| 5,495,657 A | 3/1996 | Zeisner et al. |
| 5,522,785 A | 6/1996 | Kedl et al. |
| 5,527,209 A | 6/1996 | Volodarsky et al. |
| 5,701,625 A | 12/1997 | Siman |
| 5,707,186 A | 1/1998 | Gobell et al. |
| 5,715,557 A | 2/1998 | Hsu |
| 5,749,584 A | 5/1998 | Skinner et al. |
| 5,829,087 A | 11/1998 | Nishimura et al. |
| 5,901,643 A | 5/1999 | Bornhorst |
| 5,924,154 A | 7/1999 | Gockel et al. |
| 6,070,284 A | 6/2000 | Garcia et al. |
| 6,082,377 A | 7/2000 | Frey |
| 6,119,295 A | 9/2000 | Gockel |
| 6,247,197 B1 | 6/2001 | Vail |
| 6,308,369 B1 | 10/2001 | Garcia et al. |
| 6,324,714 B1 | 12/2001 | Walz et al. |
| 6,378,158 B1 * | 4/2002 | Bukovitz ............ 15/230.11 |
| 6,728,989 B2 | 5/2004 | Lerner et al. |
| 6,820,298 B2 | 11/2004 | White et al. |
| 7,389,560 B2 * | 6/2008 | Mertins, Jr. ............ 15/230.11 |
| 7,657,959 B2 * | 2/2010 | Smith et al. ............ 15/230.11 |
| 2005/0172438 A1 | 8/2005 | Yudovsky et al. |
| 2007/0209135 A1 | 9/2007 | Chen |
| 2009/0031516 A1 | 2/2009 | Yudovsky et al. |

FOREIGN PATENT DOCUMENTS

| | | |
|---|---|---|
| DE | 19925375 A1 | 2/2001 |
| EP | 0 837 493 A2 | 4/1998 |
| EP | 0 878 831 A2 | 11/1998 |
| FR | 2671304 A1 | 7/1992 |
| GB | 2291951 A | 2/1996 |
| GB | 2 325 782 A | 12/1998 |
| JP | 54063613 | 4/1980 |

OTHER PUBLICATIONS

Feb. 5, 2010 Response to Office Action of U.S. Appl. No. 12/239,724 mailed Nov. 9, 2009.
U.S. Appl. No. 09/580,879, filed May 30, 2000.
First Office Action of Chinese Patent Application No. 200580003452.4 issued Mar. 7, 2008.
International Search Report and Written Opinion of Internationl Application No. PCT/US2005/002753 dated SEp. 16, 2005.
International Preliminary Report on Patentability and Written Opinion of Internationl Application No. PCT/US2005/002753 dated Aug. 10, 2006.
Office Action of U.S. Appl. No. 09/580,879 Mailed Mar. 17, 2003.
Notice of Abandonment of U.S. Appl. No. 09/580,879 Mailed Oct. 9, 2003.
Office Action of U.S. Appl. No. 11/048,099 Mailed Sep. 26, 2008.
Jan. 26, 2009 Response to Office Action of U.S. Appl. No. 11/048,099 Mailed Sep. 26, 2008.
Final Office Action of U.S. Appl. No. 11/048,099 Mailed Apr. 24, 2009.
Brown et al., U.S. Appl. No. 09/580,879, filed May 30, 2000.
Office Action of U.S. Appl. No. 12/239,724 Mailed Nov. 9, 2009.
Final Office Action of U.S. Appl. No. 12/239,724 Mailed May 10, 2010.

* cited by examiner

METHODS AND APPARATUS FOR INSTALLING A SCRUBBER BRUSH ON A MANDREL

This application is a division of, and claims priority to, U.S. Non-Provisional patent application Ser. No. 11/048,099, filed Jan. 28, 2005 now abandoned, and titled, "METHODS AND APPARATUS FOR INSTALLING A SCRUBBER BRUSH ON A MANDREL," which claims priority to U.S. Provisional Patent Application Ser. No. 60/540,140, filed Jan. 29, 2004, and titled, "METHOD AND APPARATUS FOR INSTALLING A SCRUBBER BRUSH ON A MANDREL". Both of these patent applications are hereby incorporated by reference herein in their entirety for all purposes.

FIELD OF THE INVENTION

The present invention relates generally to semiconductor device manufacturing, and more particularly to methods and apparatus for installing a scrubber brush on a mandrel.

BACKGROUND OF THE INVENTION

A scrubber brush assembly, which includes a scrubber brush coupled to a mandrel, may be used for cleaning a substrate. For example, the scrubber brush assembly may be employed in a substrate processing system, such as a substrate cleaning system, to scrub a major surface of a substrate during substrate processing. Further, the scrubber brush assembly may be used in other substrate processing systems.

To assemble the scrubber brush assembly for use in a substrate processing system, the scrubber brush must be installed (e.g., slid) onto the mandrel. However, installing a scrubber brush on a mandrel is difficult due to friction created between the scrubber brush and the mandrel during assembly. Accordingly, improved methods and apparatus for installing a scrubber brush on a mandrel are desired.

SUMMARY OF THE INVENTION

In a first aspect of the invention, a method is provided for assembling a scrubber brush assembly. The method includes the steps of (1) inserting one or more inserts into an opening of a scrubber brush, wherein the opening of the scrubber brush is defined by an interior surface of the scrubber brush; (2) inserting a mandrel into the opening of the scrubber brush such that the one or more inserts are between an exterior surface of the mandrel and the interior surface of the scrubber brush; and (3) removing the one or more inserts to allow the exterior surface of the mandrel to contact the interior surface of the scrubber brush, thereby installing the scrubber brush onto the mandrel.

In a second aspect of the invention, a first apparatus is provided. The first apparatus includes a scrubber brush assembly fixture that includes a housing having (1) a first end defining a first opening; and (2) a second end defining a second opening for receiving a mandrel to be installed in a scrubber brush. The second end includes one or more of features around a perimeter of the second opening, adapted to receive a first end of an insert. The first apparatus also includes one or more inserts adapted to couple to the housing via the one or more features.

In a third aspect of the invention, a second apparatus is provided. The second apparatus includes a mandrel adapted to be inserted into a scrubber brush so as to form a scrubber brush assembly. The mandrel has (1) a first end; (2) a second end; and (3) one or more position guides adjacent at least one of the first and second ends adapted to position a scrubber brush on the mandrel. Numerous other aspects are provided in accordance with these and other aspects of the invention.

Other features and aspects of the present invention will become more fully apparent from the following detailed description, the appended claims and the accompanying drawings.

DETAILED DESCRIPTION

A scrubber brush assembly, which includes a scrubber brush coupled to a mandrel, may be used for cleaning a substrate. For example, the scrubber brush assembly may be employed in a substrate processing system, such as a substrate cleaning system, to scrub a major surface of a substrate during substrate processing. Further, the scrubber brush assembly may be used in other substrate processing systems.

To assemble the scrubber brush assembly for use in a substrate processing system, the scrubber brush must be installed (e.g., slid) onto the mandrel. However, installing a scrubber brush on a mandrel is difficult due to friction created between the scrubber brush and the mandrel during assembly. The present methods and apparatus reduce friction created between the scrubber brush and mandrel while assembling the brush assembly.

Figure 1:
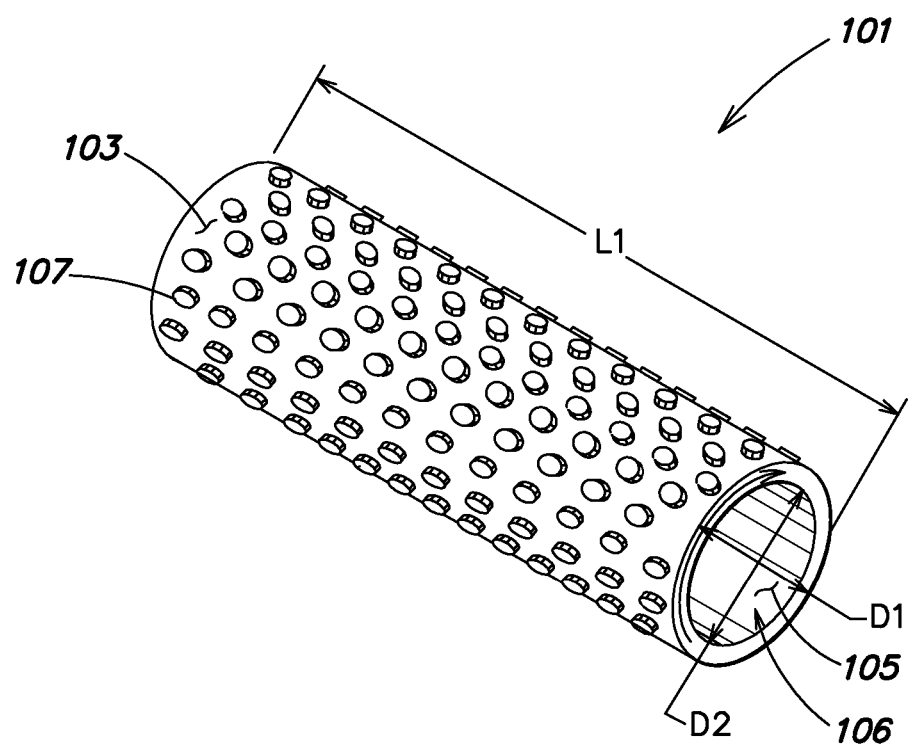
FIG. 1 is an isometric view of a brush that may be included in a brush assembly in accordance with an embodiment of the present invention.

FIG. 1 is an isometric view of a brush 101 that may be included in a brush assembly in accordance with an embodiment of the present invention. The brush 101 may be cylindrical in shape and may be a length L1. The brush 101 includes an exterior surface 103, which may be of a diameter D1. The exterior surface 103 of the brush 101 may be profiled. For example, the exterior surface 103 of the brush 101 may include raised surface features 107, such as nodules. Alternatively, in other embodiments, the exterior surface 103 of the brush 101 may include a smooth geometry. The brush 101 may, for example, be porous and/or sponge like and/or may be comprised of a resilient material such as polyvinyl acetate (PVA). The brush 101 may comprise other and/or different materials, and may exhibit other and/or different material characteristics.

The brush 101 may include an interior surface 105 which defines an opening 106 of a diameter D2. The interior surface 105 of the brush 101 may include features, such as knurling, grooves, a rough finish, etc., which create high friction when the interior surface 105 of the brush 101 contacts a mandrel of a brush assembly (as described below) and thereby deter slippage between the brush 101 and mandrel. The interior surface 105 of the brush 101 may include additional and/or other features.

Figure 2:
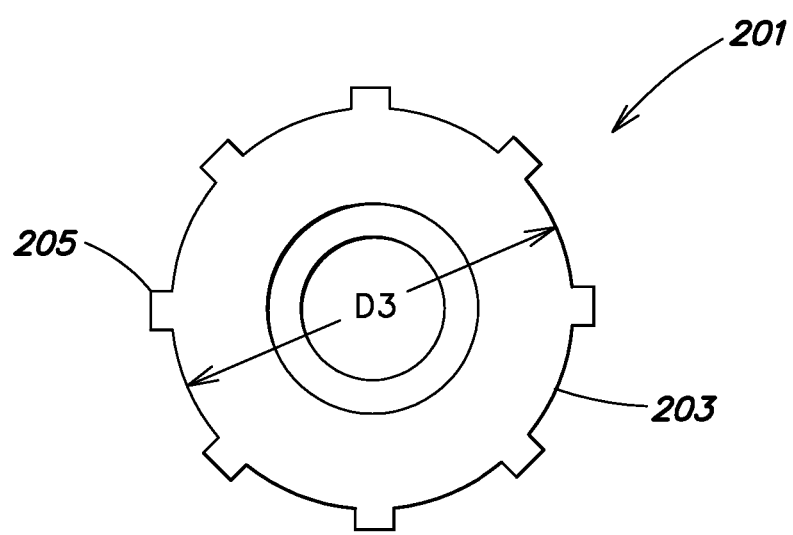
FIG. 2 is an end view of a first exemplary mandrel in accordance with an embodiment of the present invention.
Figure 3:
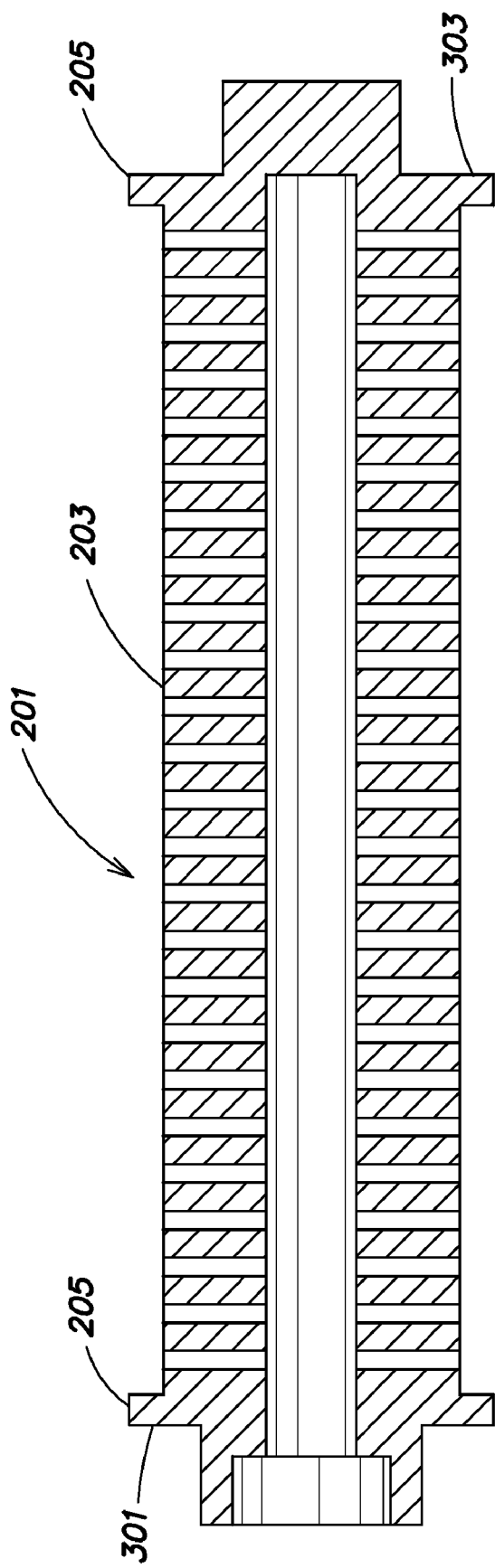
FIG. 3 is a cross-sectional view of the first exemplary mandrel of FIG. 2 in accordance with an embodiment of the present invention.
Figure 4:
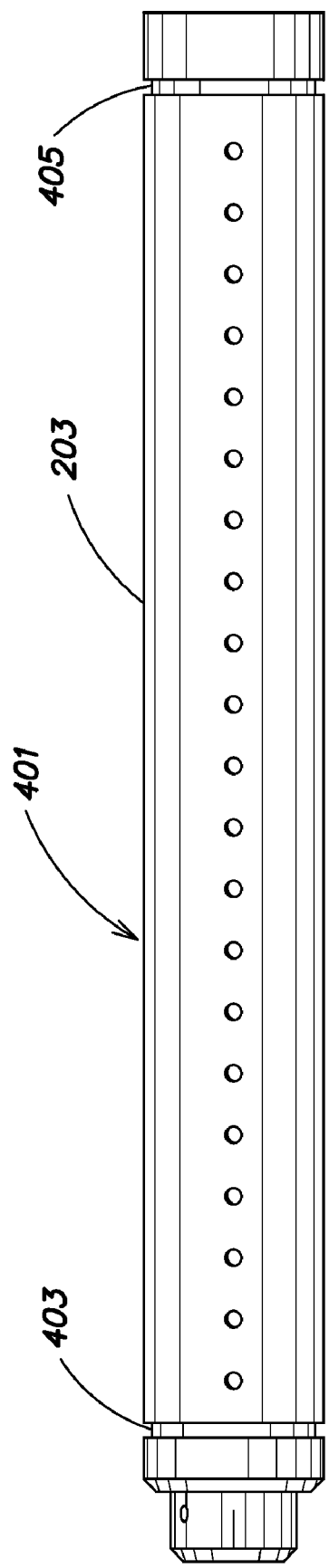
FIG. 4 is a side view of a second exemplary mandrel in accordance with an embodiment of the present invention.

FIGS. 2 and 3 are an end view and a cross-sectional view, respectively, of a first exemplary mandrel 201 in accordance with an embodiment of the present invention. The mandrel 201 is cylindrical in shape with a diameter D3, which is approximately the diameter D2 of the interior surface 105 of the brush 101. The mandrel 201 includes an exterior surface 203 that contacts the interior surface 105 of the brush 101 when the mandrel 201 is inserted into the brush 101 (e.g., the brush 101 is installed onto the mandrel 201) to form a brush assembly. Similar to the interior surface 105 of the brush 101, the exterior surface 203 of the mandrel 201 may include features, such as knurling, grooves, a rough finish, etc., which create high friction when the exterior surface 203 of the mandrel 201 contacts the brush 101. In some embodiments, the mandrel 201 may include one or more notches or tabs 205 along a perimeter of an end of the mandrel 201 to ensure that the brush 101 does not extend therepast. In this manner, the tabs 205 along the first end 301 and second end 303 of the mandrel 201 may serve as position guides for the brush 101 as well as prevent the brush 101 from moving (e.g., sliding) off the mandrel 201 during operation of the brush assembly. As will be described further below, the tabs 205 included along the one or more ends 301, 303 of the mandrel 201 may serve to guide a portion of an inventive brush assembly fixture (described below), as well. Alternatively or additionally, in some embodiments, the exterior surface 203 of a mandrel may include a different type of position guide, such as one or more grooves (e.g., V-shaped grooves). For example, FIG. 4 is a side view of a second exemplary mandrel in accordance with an embodiment of the present invention. With reference to FIG. 4, the second exemplary mandrel 401 may be similar to the first exemplary mandrel 201. The second exemplary mandrel 401 may include a first and/or second groove 403, 405 along the exterior surface 203 of the mandrel 401. The first and/or second groove 403, 405 may serve as a position guide for a brush installed on the mandrel 401. For example, when installing a brush 101 on the mandrel 401, a user may align an end of the brush with one of the first and/or second grooves 403, 405.

As shown in FIGS. 3-4, the first and/or second exemplary mandrel 201, 401 may be a single-piece mandrel. However, in some embodiments, the first and/or second mandrel 201, 401 may include a plurality of pieces coupled together.

Figure 5:
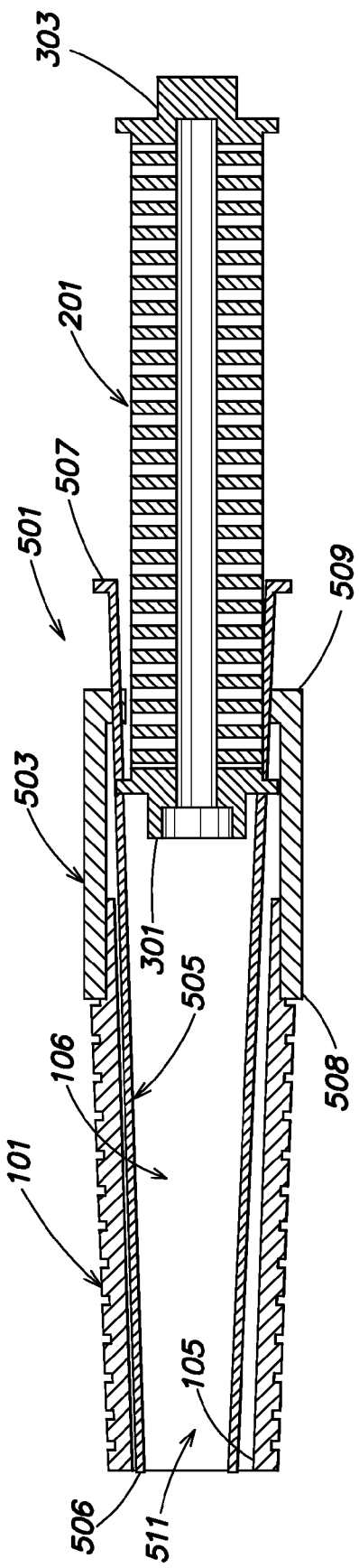
FIG. 5 is a lengthwise cross-sectional view of a mandrel being inserted into a brush to form the brush assembly using a brush assembly fixture in accordance with an embodiment of the present invention.

FIG. 5 is a lengthwise cross-sectional view of a mandrel 201 being inserted into a brush 101 to form a brush assembly using a brush assembly fixture 501 in accordance with an embodiment of the present invention. The brush assembly fixture 501 includes a housing 503 and one or more strips 505, each of which has a first end 506 and a second end 507, coupled thereto. A first end 508 of the housing 503 may be adapted to couple to an end of the brush 101 so as to allow items inserted into the housing 503 to be inserted into the brush 101. A second end 509 of the housing 503 may be adapted to couple to and receive a first end 506 of the one or more strips 505 and an end 301, 303 of the mandrel 201. As will be described further below, the brush assembly fixture 501 may be used for assembling the brush assembly (e.g., the brush 101 and the mandrel 201).

Figure 6:
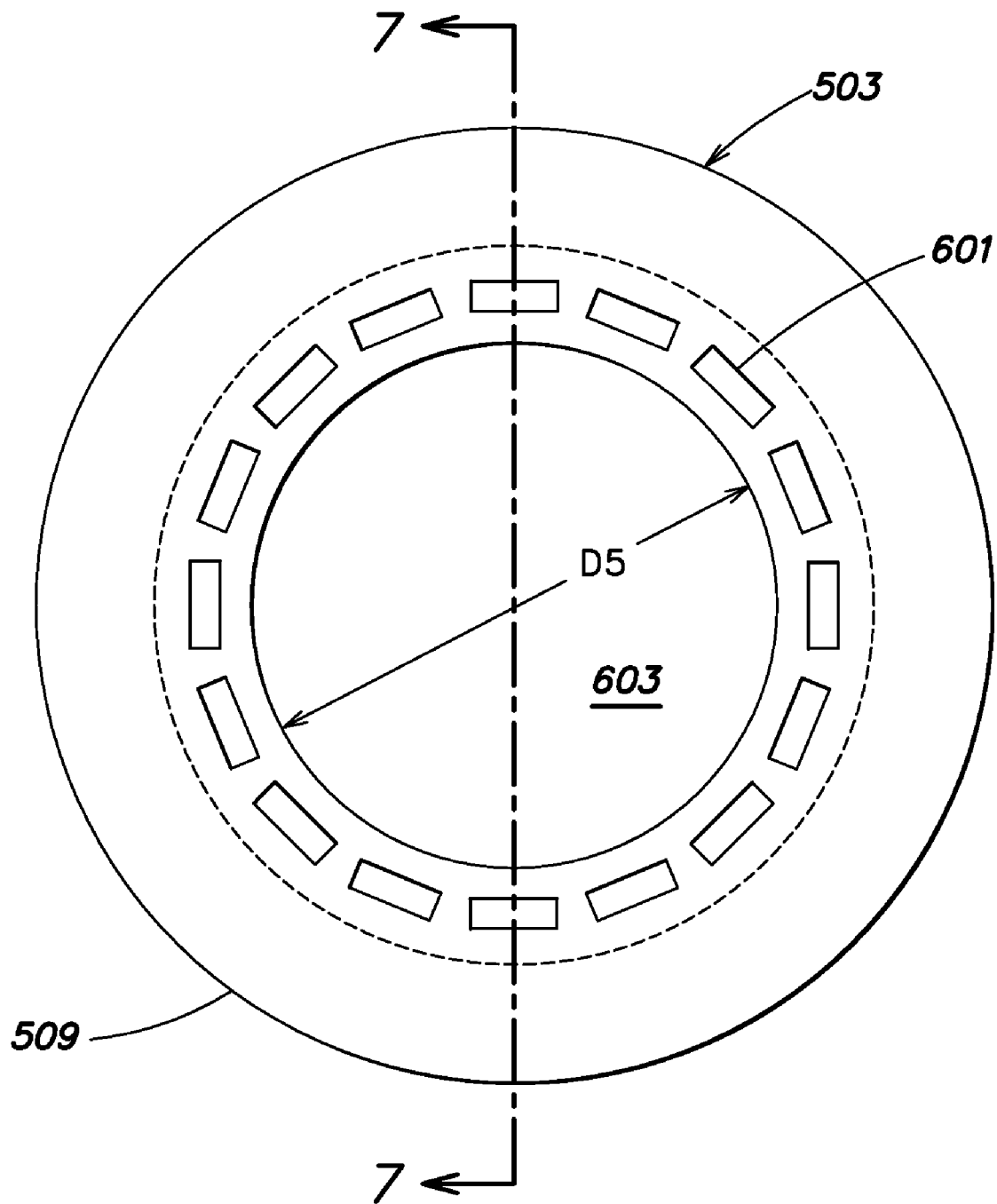
FIG. 6 is an end view of a housing of the brush assembly fixture of FIG. 5 in accordance with an embodiment of the present invention.
Figure 7:
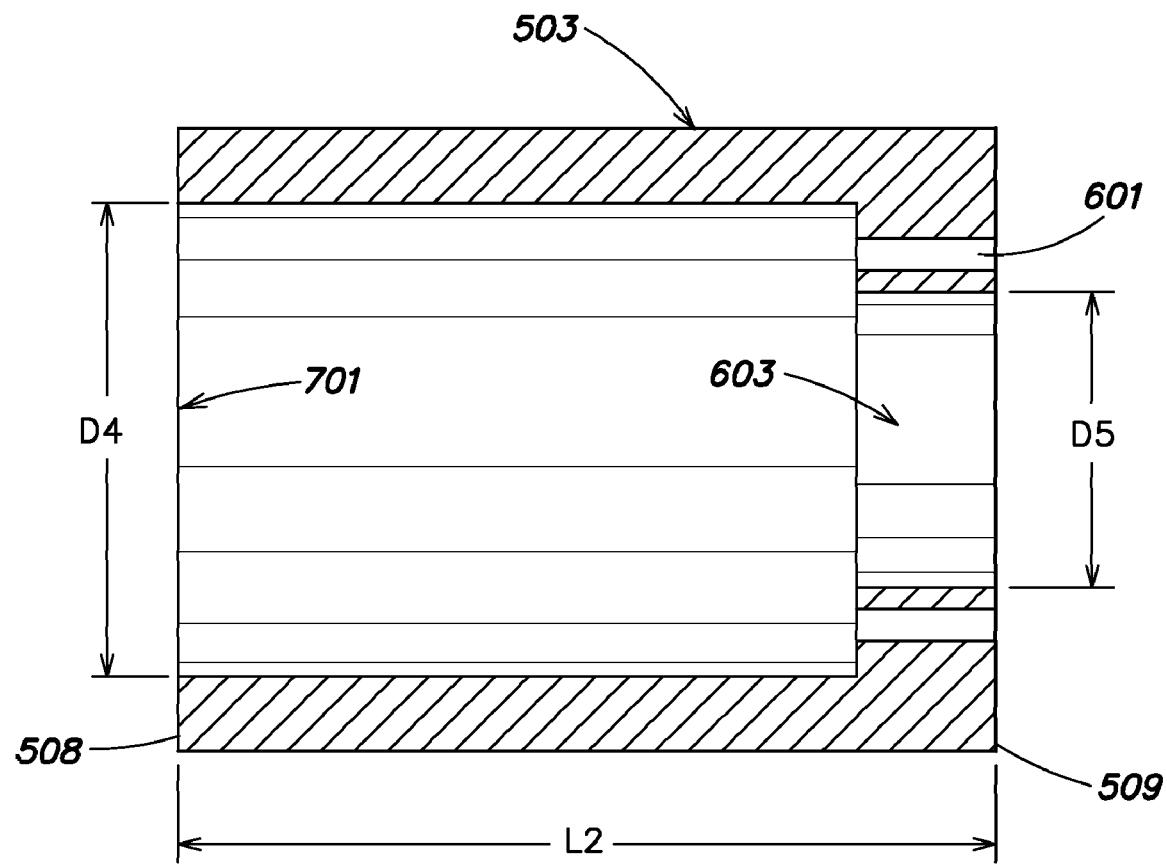
FIG. 7 is a cross-sectional view taken along line 7-7 of the housing of FIG. 6 in accordance with an embodiment of the present invention.

FIGS. 6 and 7 are an end view and a cross-sectional view taken along line 7-7, respectively, of the housing 503 in accordance with an embodiment of the present invention. With reference to FIGS. 6 and 7, the second end 509 of the housing 503 includes one or more slots 601 for receiving one or more strips 505 (FIG. 5) to form the brush assembly fixture 501. In one embodiment, the number of slots 601 included in the housing 503 may correspond to the number of tabs 205 included along the perimeter of one or more ends 301, 303 of the mandrel 201. Other numbers of slots 601 may be employed. Each strip 505 may be formed from a low-friction material, such as polytetrafluoroethylene (e.g., Teflon®) for example, or from other materials. Each strip 505 is sized such that the first end 506 of the strip 505 may be inserted into a slot 601 included in the housing 503. A second end 507 of each strip 505 preferably is bent to allow the second end 507 of the strip 505 to rest in the housing 503 without going through the slot 601. The length of each strip 505 may be greater than the combined lengths of the housing L2 and the brush L1. Other strip lengths may be employed. For example, a strip 505 may be other lengths so long as when the strip 505 is inserted into a slot 601 of the housing 503, the strip 505 extends through the housing 503 and into the interior surface 105 of the brush 101. In one exemplary embodiment, for a brush assembly including a brush about 12.5 inches long, each strip 505 may be approximately 11-12.75 inches long, approximately 0.2 inches wide and approximately 0.1 inch thick. Other strip dimensions may be employed.

The first end 508 of the housing 503 may include a first opening 701 of a diameter D4 for coupling to and/or receiving the exterior surface 103 of the brush 101. The diameter D4 of the first opening 701 may be approximately equal to the diameter D1 of the exterior surface 103 of the brush 101. In other embodiments, the diameter D4 of the first opening 701 may be larger or smaller.

Similarly, the second end 509 of the housing 503 may include a second opening 603 of a diameter D5 for receiving an end 301, 303 of the mandrel 201. The diameter D5 of the opening 503 may be approximately equal to the diameter D3 of the mandrel 201. In other embodiments, the diameter D5 of the second opening 503 may be larger or smaller.

Figure 8:
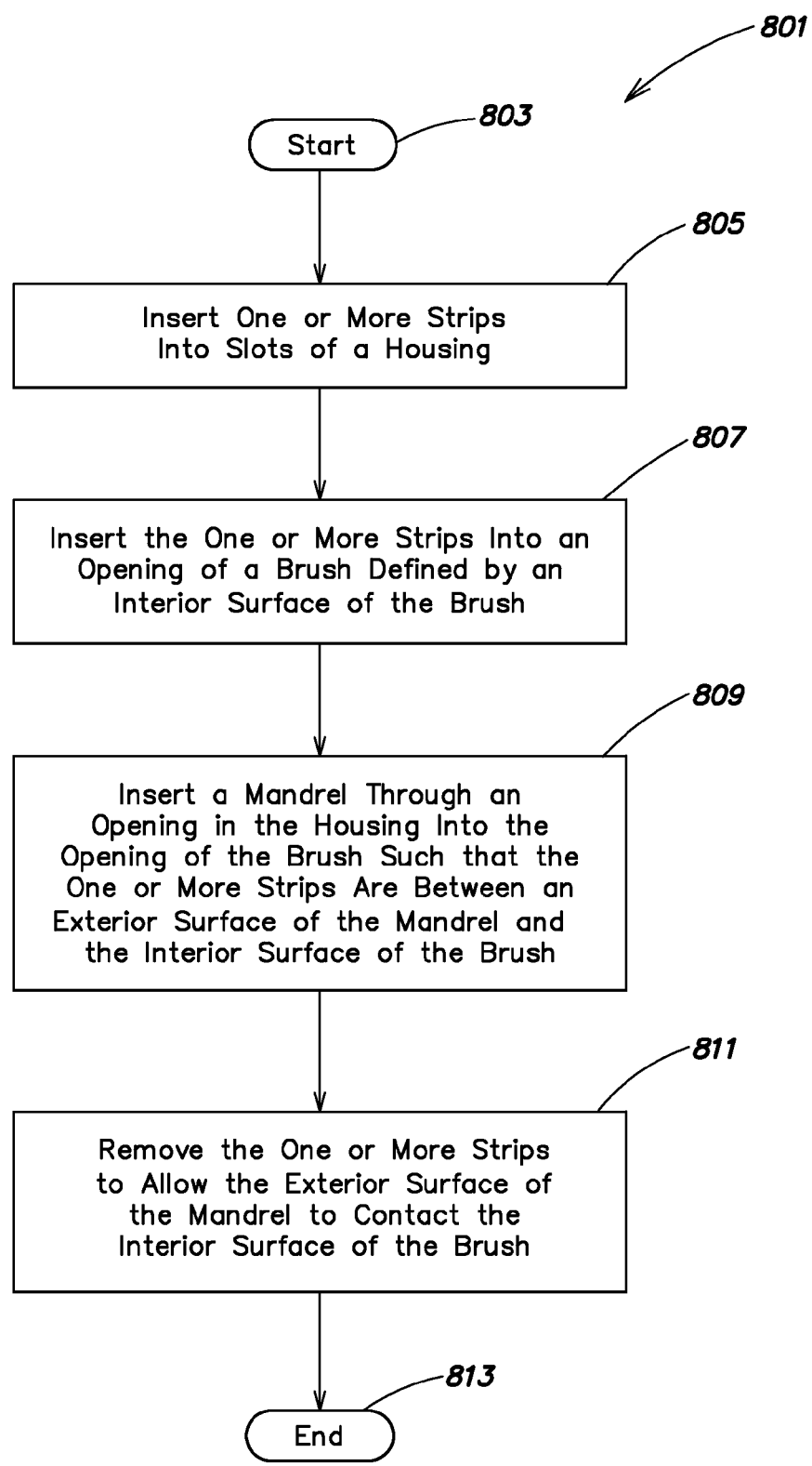
FIG. 8 illustrates an exemplary method for use of the inventive brush assembly fixture in accordance with an embodiment of the present invention.

The operation of the brush assembly fixture 501 for assembling a brush assembly is now described with reference to FIGS. 1-7 and 9 and with reference to FIG. 8 which illustrates an exemplary method 801 for use of the inventive brush assembly fixture in accordance with an embodiment of the present invention. More specifically, an exemplary method for installing a brush 101 onto a mandrel 201, 401 (e.g., inserting a mandrel 201, 401 into a brush 101) is described. With reference to FIG. 8, in step 803, the method 801 begins. In step 805, one or more strips may be inserted into a housing 503 of the brush fixture assembly. More specifically, a first end 506 of one or more strips 505 may be inserted into one or more slots 601 included around a perimeter of a second opening 603 in a second end 509 of the housing 503, respectively.

The first end 506 of the strip 505 is inserted into the slot 601 until a second end 507 (e.g., the bent end) of the strip 505 rests in the housing 503. The first end 506 of the strip 505 extends through the first opening 701 of the housing 503. In one embodiment, a strip 505 may be inserted into each slot 601 included in the housing 503. In this manner, the brush assembly fixture 501 is assembled.

Figure 9:
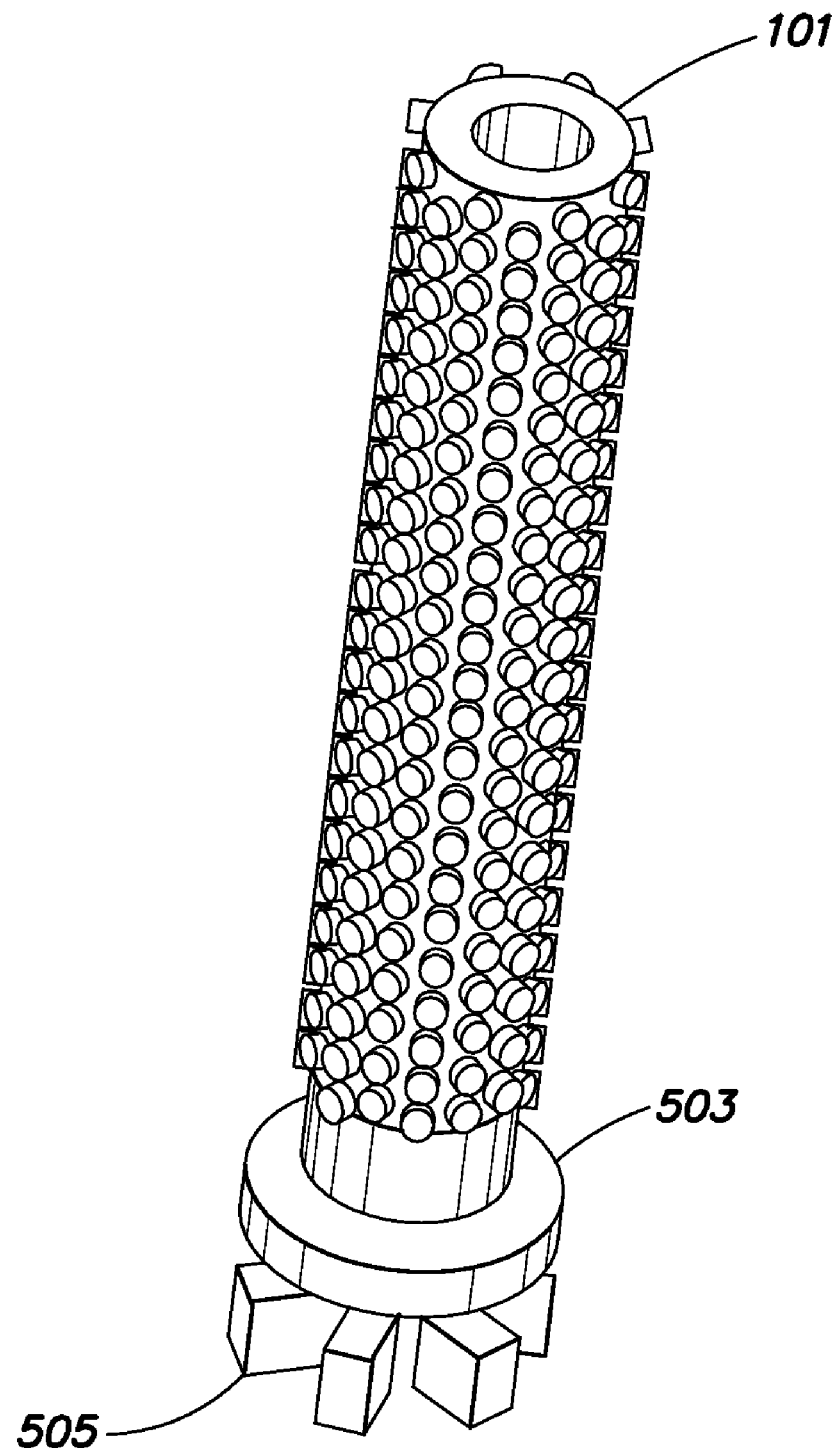
FIG. 9 is an isometric view of one or more strips inserted into a brush opening in accordance with an embodiment of the present invention.

In step 807, the one or more strips 505 are inserted into an opening 106 of a brush 101. The opening 106 of the brush 101 may be defined by an interior surface 105 of the brush 101. The first end 506 of the one or more strips 505, which extends through the first opening 701 of the housing 503, are inserted into the opening 106 of the brush 101 such that the one or more strips 505 are adjacent the interior surface 105 of the brush 101. As described above, the length of the one or more strips 505 may be defined such that the one or more strips 505 are adjacent the interior surface 105 of the brush 101 throughout the entire length L1 of the brush 101. Alternatively, strips of other lengths may be employed. FIG. 9 is an isometric view of one or more strips 505 inserted into an opening of a brush 101 in accordance with an embodiment of the present invention. More specifically, with reference to FIG. 9, after step 807 is performed, the one or more strips 505 may extend through the housing 503 and into the opening of the brush 101 in the manner described above.

In step 809, a mandrel 201, 401 may be inserted through an opening in the housing 503 into the opening 106 of the brush 101 such that the one or more strips 505 are between an exterior surface 203 of the mandrel 201, 401 and the interior surface 105 of the brush 101. More specifically, an end 301, 303 of the mandrel 201, 401 may be inserted through the second opening 603 of the housing 503, the first opening 701 of the housing 503, the opening 106 of the brush 101, and through the interior surface 105 of the brush 101 until the end 301, 303 of the mandrel 201, 401 exits the other opening (not shown in FIG. 1; 511 in FIG. 5) of the brush 101. While the end 301, 303 of the mandrel 201, 401 is inserted into and through the brush 101, the one or more strips 505 are between the mandrel 201, 401 and the brush 101. Preferably, the exterior surface 203 of the mandrel 201, 401 will predominately contact the one or more strips 505 while being inserted into the brush 101 to form the brush assembly. As stated, the one or more strips 505 are formed from polytetrafluoroethylene (e.g., Teflon®) or similar low-friction material. Therefore, in contrast to the high-friction interface created when the exterior surface 203 of the mandrel 201, 401 which may include features such as knurling, grooves, a rough finish, etc., directly contacts the interior surface 105 of the brush 101, the interface between the mandrel 201, 401 and the one or more strips 505 creates little or no friction while the mandrel 201, 401 is inserted into the brush 101.

The notches or tabs 205 which may be included along the perimeter of one or more ends 301, 303 of the mandrel 201, 401 may serve to guide a portion (e.g., the one or more strips 505) of the brush assembly fixture 501, and therefore ensure alignment of the portion of the brush assembly fixture 501 (e.g., the one or more strips 505) with the mandrel 201, 401.

In one or more embodiments, (e.g., during step 807 and/or 809) the housing 503 may be coupled to an end of the brush 101 that includes the opening 105. Alternatively, the housing 503 may not be coupled to the brush 101 (e.g., during step 807 or 809).

In step 811, the one or more strips 505 are removed to allow the exterior surface 203 of the mandrel 201, 401 to contact the interior surface 105 of the brush 101. The second end 507 of a strip 505 may be employed to pull the strip 505 from the housing 503. Alternatively, the first end 506 of the strip 505 may be employed to push the strip 505 from the housing 503. Because the one or more strips 505 are made of polytetrafluoroethylene (e.g., Teflon®) or similar low-friction material, little or no friction is created at the interface of the one or more strips 505 and the exterior surface 203 of the mandrel 201, 401 and at the interface of the one or more strips 505 and the interior surface 105 of the brush 101. In this manner, the mandrel 201, 401 may be inserted into the brush 101, thereby assembling the brush assembly. Thereafter, if the housing 503 was coupled to the brush 101 in step 807 and/or 809, the housing 503 is removed from the brush 101.

Through the use of the method 801 of FIG. 8, a brush assembly fixture 501 may be employed to assemble a brush assembly by installing a brush 101 onto a mandrel 201, 401 (e.g., inserting a mandrel 201, 401 into a brush 101) with little difficulty. More specifically, the inventive brush assembly fixture 501 may be employed to reduce and/or eliminate the friction of the interface between the exterior surface 203 of the mandrel 201, 401 and the interior surface 105 of the brush 101 while assembling the brush assembly.

Figure 10:
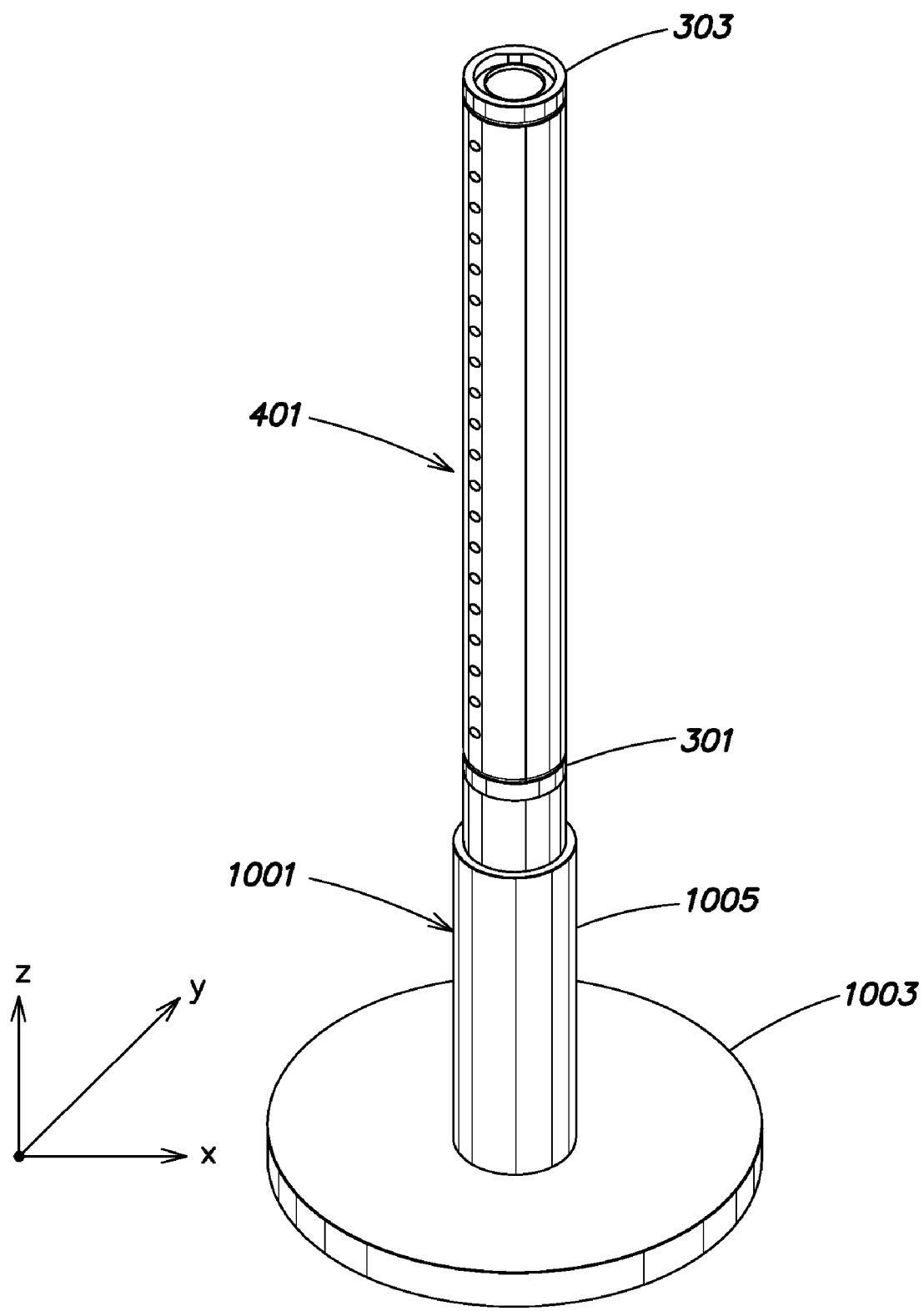
FIG. 10 is an isometric view of a base coupled to a mandrel in accordance with an embodiment of the present invention.

The foregoing description discloses only exemplary embodiments of the invention. Modifications of the above disclosed apparatus and methods which fall within the scope of the invention will be readily apparent to those of ordinary skill in the art. For instance, in some embodiments, the brush assembly fixture 501 may include a base adapted to couple to a mandrel 201, 401. FIG. 10 is an isometric view of a base coupled to a mandrel in accordance with an embodiment of the present invention. With reference to FIG. 10, the base 1001 may include a plate 1003, which is adapted for placement on a flat surface, and a pusher 1005 adapted to extend therefrom. For example, when the plate 1003 is on a flat surface (e.g., in the xy-plane), the pusher 1005 may extend in a direction substantially perpendicular thereto (e.g., in a direction substantially along the z-axis). However, in other embodiments, the orientation of the plate 1003 relative to the pusher 1005 may differ. The plate 1003 and/or pusher 1005 may be formed from plastic or the like (although different materials may be employed).

In embodiments in which the brush assembly fixture 501 includes the base 1001, before step 809 of the method 800 is performed, the mandrel 201, 401 may be coupled to the base 1001. More specifically, an end 301, 303 of the mandrel 201, 401 may be adapted to couple with the pusher 1005. When coupled to the pusher 1005, the mandrel 201, 401 may extend therefrom. For example, the mandrel 201, 401 may extend from the pusher 1005 in a direction substantially along the z-axis (although the orientation of the pusher 1005 relative to the mandrel 201, 401 may differ).

Figure 11:
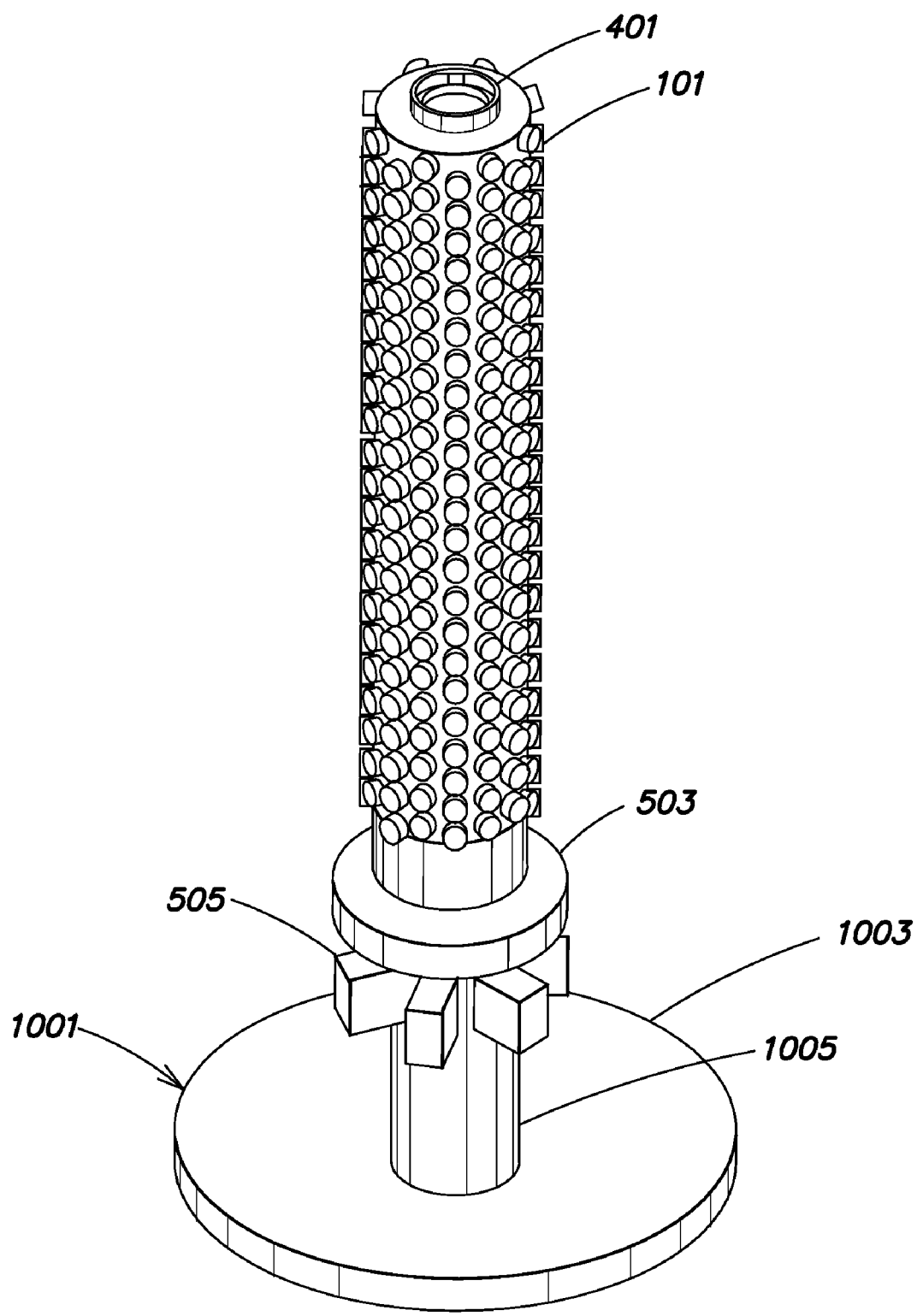
FIG. 11 is an isometric view of a mandrel inserted into the brush assembly fixture while the mandrel is coupled to the base of FIG. 10 in accordance with an embodiment of the present invention.

Thereafter, the base 1001 may be employed to perform step 809. More specifically, one end 301, 303 of the mandrel 201, 401 may be inserted through an opening 603, 701 in the housing 503 into the opening 106 of the brush 101 such that the one or more strips 505 are between an exterior surface 203 of the mandrel 201, 401 and the interior surface 105 of the brush 101, while the other end 301, 303 of the mandrel 201, 401 is coupled to the base 1001. FIG. 11 is an isometric view of a mandrel inserted into a brush assembly fixture while the mandrel is coupled to the base in accordance with an embodiment of the present invention. With reference to FIG. 11, the assembly shown in FIG. 9, which includes one or more strips 505 extending through the housing 505 and into the opening of the brush 101 may be installed on the assembly (shown in FIG. 10) including the mandrel 201, 401 coupled to the base 1001.

Figure 12:
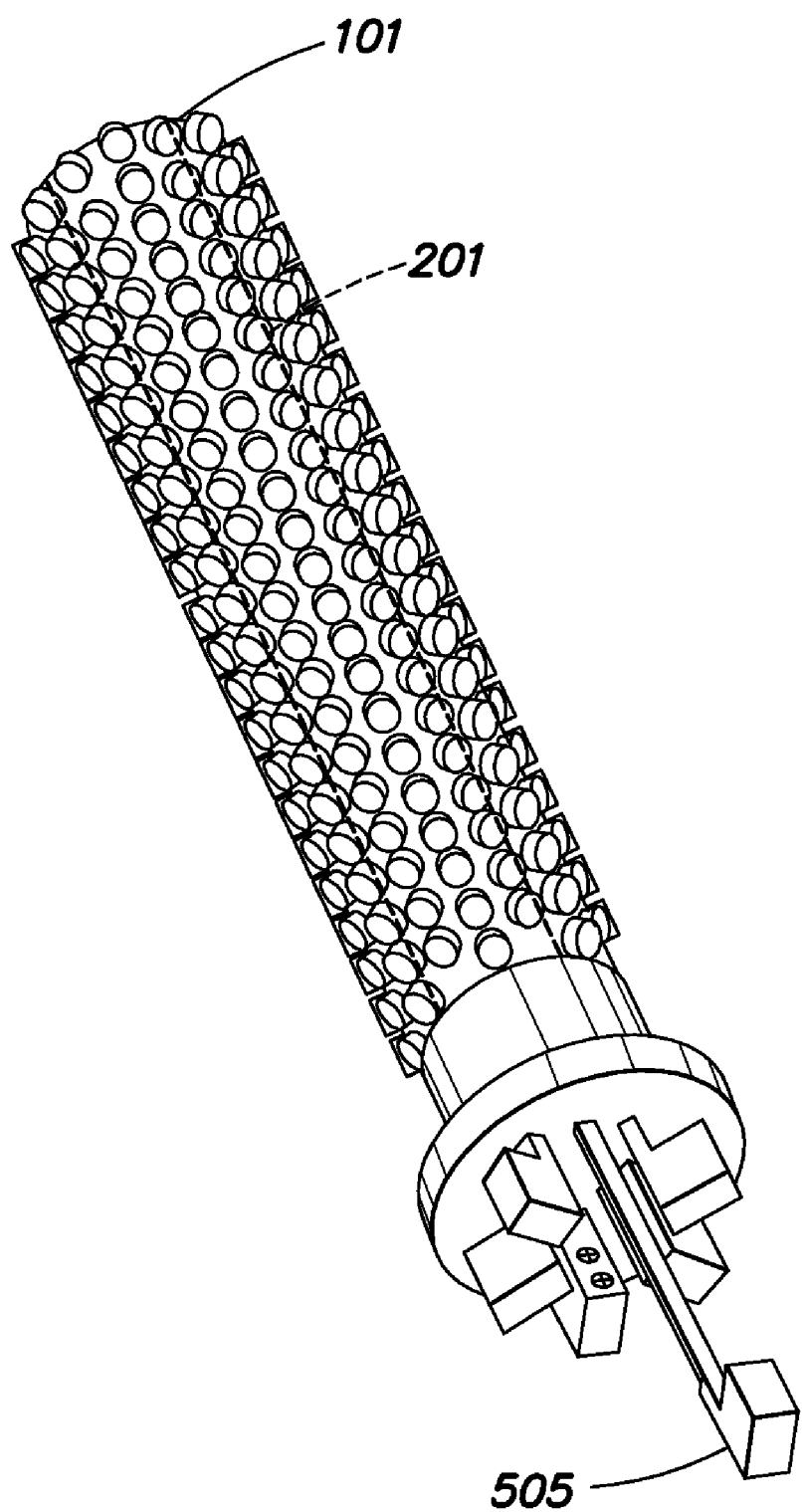
FIG. 12 is an isometric view of a mandrel (shown in phantom) along with a brush mounted thereon, and portions of a brush assembly fixture coupled thereto in accordance with an embodiment of the present invention.

Thereafter, the mandrel 201, 401 along with the brush 101 mounted thereon, and the portion of the brush assembly fixture coupled thereto (e.g., the housing 503 and the one or more strips 505) may be removed from the base 1001. Once the mandrel 201, 401 is removed from the base 1001, step 811 (described above) may be performed. FIG. 12 is an isometric view of the mandrel 201, 401 (shown in phantom) along with the brush 101 mounted thereon, and portions of the brush assembly fixture coupled thereto from which the one or more strips 505 are being removed in accordance with an embodiment of the present invention. Once the one or more strips 505 are removed and/or the housing 503 is removed, the interior surface 105 of the brush 101 may contact the exterior surface 203 of the mandrel 201, 401, and in this manner, the brush 101 may be installed on the mandrel 201, 401.

Although in one or more embodiments, the one or more strips 505 are flat, the one or more strips 505 may be other shapes. In such embodiments, the slots 601 included in the housing 503 may be adjusted accordingly. Further, although in one or more embodiments, one or more strips 505 are inserted into the housing 503, in other embodiments, rather than using strips, a cylinder (e.g., a cylinder formed of polytetrafluoroethylene (e.g., Teflon®) or similar low-friction material) with a first end and a second end, which is bent, may be inserted into the housing 503 such that the second end rests in the housing 503. In such an embodiment, the slots 601 are replaced with an appropriate opening to receive the first end of the cylinder. Although, in some embodiments described above, the brush assembly fixture 501 may be a two-piece assembly, the one or more strips 505 may be permanently coupled to the housing 503 to form a one-piece brush assembly fixture such that removal of the housing also removes all of the strips. Although a cylindrical housing 503 and brush 101 are employed, other shapes may be used for the housing 503 and/or the brush 101. In sum, the invention employs a low friction material insert (e.g., strips) that may be coupled so as to be between the brush and mandrel during assembly. In this manner, brush/mandrel assembly is facilitated. The insert(s) may be coupled to a housing which may be coupled to or held adjacent the brush or mandrel, or the insert(s) may be directly coupled to the brush and/or mandrel rather than to a housing.

In one aspect of the invention, methods and apparatus are provided for assembling a brush assembly by (1) inserting one or more inserts into an opening of a brush, wherein the opening of the brush is defined by an interior surface of the brush; (2) inserting a mandrel into the opening of the brush such that the one or more inserts are between an exterior surface of the mandrel and the interior surface of the brush; and (3) removing the one or more inserts to allow the exterior surface of the mandrel to contact the interior surface of the brush, thereby installing the brush onto the mandrel.

Accordingly, while the present invention has been disclosed in connection with exemplary embodiments thereof, it should be understood that other embodiments may fall within the spirit and scope of the invention, as defined by the following claims.

The invention claimed is:

1. A method for assembling a scrubber brush assembly, comprising:
   inserting one or more inserts into an opening of a scrubber brush, wherein the opening of the scrubber brush is defined by an interior surface of the scrubber brush;
   inserting a mandrel into the opening of the scrubber brush such that the one or more inserts are between an exterior surface of the mandrel and the interior surface of the scrubber brush; and
   removing the one or more inserts to allow the exterior surface of the mandrel to contact the interior surface of the scrubber brush, thereby installing the scrubber brush onto the mandrel.

2. The method of claim 1 wherein:
   inserting the one or more inserts into an opening of a scrubber brush includes:
   inserting the one or more inserts into a housing.

3. The method of claim 2 further comprising:
   extending the one or more inserts through the housing and into the interior surface of the scrubber brush.

4. The method of claim 2 wherein inserting the one or more inserts into the housing further comprises:
   inserting a first end of the insert into a slot included in the housing.

5. The method of claim 4 further comprising:
   resting a second end of the insert in the housing without the second end of the insert being inserted into the slot.

6. The method of claim 5 further comprising:
   inserting the one or more inserts into the opening of the scrubber brush while in the housing.

7. The method of claim 6 wherein removing the one or more inserts to allow the exterior surface of the mandrel to contact the interior surface of the scrubber brush further comprises:
   removing the one or more inserts from the housing.

8. The method of claim 7 wherein removing the one or more inserts further comprises:
   employing the second end of the insert to pull the insert from the housing.

9. The method of claim 7 wherein removing the one or more inserts further comprises:
   employing the first end of the insert to push the insert from the housing.

10. The method of claim 1 wherein inserting the mandrel into the opening of the scrubber brush such that the one or more inserts are between the exterior surface of the mandrel and the interior surface of the scrubber brush includes:
    reducing friction between the exterior surface of the mandrel and the interior surface of the scrubber brush.

11. The method of claim 1 further comprising:
    inserting the mandrel into the opening of the scrubber brush until an end of the mandrel exits a second opening of the scrubber brush.

12. The method of claim 1 wherein the one or more inserts comprise low friction inserts.

13. The method of claim 1 further comprising:
    aligning the inserts with the mandrel via one or more position guides included on the mandrel.

14. The method of claim 13 wherein the position guides include one or more grooves along a perimeter of the mandrel.

15. The method of claim 1 further comprising:
    creating a high friction interaction between the interior surface of the scrubber brush and the exterior surface of the mandrel via at least one of at least one of knurls, grooves, and a rough finish, included on each of the interior surface of the scrubber brush and the exterior surface of the mandrel.

16. The method of claim 1 further comprising:
    coupling the mandrel onto a base before inserting the mandrel into the opening of the scrubber brush such that the one or more inserts are between an exterior surface of the mandrel and the interior surface of the scrubber brush.

17. The method of claim 16 further comprising:
    placing a plate of the base on a flat surface, and extending a pusher from the plate, wherein an end of the mandrel is coupled to the pusher.

18. The method of claim 16 further comprising:

removing the mandrel from the base after inserting the mandrel into the opening of the scrubber brush such that the one or more inserts are between an exterior surface of the mandrel and the interior surface of the scrubber brush.

19. The method of claim 1 wherein a diameter of the mandrel is approximately equal to a diameter of an interior of the scrubber brush.

20. The method of claim 1 wherein the mandrel is a single-piece mandrel.

* * * * *